United States Patent
Kim et al.

(10) Patent No.: US 12,258,268 B2
(45) Date of Patent: Mar. 25, 2025

(54) METHOD FOR PURIFYING HYDROGEN PEROXIDE

(71) Applicant: OCI COMPANY LTD., Seoul (KR)

(72) Inventors: Deokyun Kim, Gyeonggi-do (KR); Hyejin Kim, Gyeonggi-do (KR); Kyungyeol Kim, Gyeonggi-do (KR); Yongil Kim, Gyeonggi-do (KR)

(73) Assignee: OCI COMPANY LTD., Seoul (KR)

( * ) Notice: Subject to any disclaimer, the term of this patent is extended or adjusted under 35 U.S.C. 154(b) by 966 days.

(21) Appl. No.: 17/269,006

(22) PCT Filed: Jan. 25, 2019

(86) PCT No.: PCT/KR2019/001135
§ 371 (c)(1),
(2) Date: Feb. 2, 2022

(87) PCT Pub. No.: WO2020/036274
PCT Pub. Date: Feb. 20, 2020

(65) Prior Publication Data
US 2023/0242400 A1    Aug. 3, 2023

(30) Foreign Application Priority Data

Aug. 17, 2018   (KR) .................. 10-2018-0096017

(51) Int. Cl.
*C01B 15/013*     (2006.01)
*B01D 3/14*       (2006.01)
(Continued)

(52) U.S. Cl.
CPC .......... *C01B 15/0135* (2013.01); *B01D 3/145* (2013.01); *B01D 15/08* (2013.01);
(Continued)

(58) Field of Classification Search
CPC ... C01B 15/0135; C01B 15/013; B01D 3/145; B01D 15/08; B01D 61/025; B01D 61/42;
(Continued)

(56) References Cited

U.S. PATENT DOCUMENTS 4,357,217 A   11/1982   Kuehn et al.
5,928,621 A    7/1999   Ledon et al.
(Continued)

FOREIGN PATENT DOCUMENTS

CN    101804969 A    8/2010
EP      3260578 A1  12/2017
(Continued)

OTHER PUBLICATIONS

International Preliminary Report on Patentability, issued on Feb. 23, 2021, from International Application No. PCT/KR2019/001135, filed on Jan. 25, 2019. 11 pages.
(Continued)

*Primary Examiner* — Daniel C. McCracken
*Assistant Examiner* — Joshua Maxwell Speer
(74) *Attorney, Agent, or Firm* — HoustonHogle LLP

(57) ABSTRACT

The present invention relates to a method for purifying hydrogen peroxide, and more particularly, to a method including purifying a crude product of hydrogen peroxide using a primary purification system, and purifying a primarily purified hydrogen peroxide solution using a secondary purification system. One of the primary purification system and the secondary purification system includes an electrodeionization system, and the other one of the primary purification system and the secondary purification system includes at least one from among a distillation system, a resin system, a reverse osmosis system, and a combination system thereof.

8 Claims, 6 Drawing Sheets

(51) Int. Cl.
*B01D 15/08* (2006.01)
*B01D 61/02* (2006.01)
*B01D 61/42* (2006.01)
*B01D 61/48* (2006.01)
*B01D 61/58* (2006.01)
*B08B 3/08* (2006.01)
*H01L 21/02* (2006.01)

(52) U.S. Cl.
CPC ........... *B01D 61/025* (2013.01); *B01D 61/42* (2013.01); *B01D 61/48* (2013.01); *B01D 61/58* (2013.01); *B08B 3/08* (2013.01); *B01D 2313/221* (2022.08); *B01D 2313/40* (2013.01); *B01D 2317/025* (2013.01); *H01L 21/02041* (2013.01)

(58) Field of Classification Search
CPC .. B01D 61/48; B01D 61/58; B01D 2313/221; B01D 2313/40; B01D 2317/025; B01D 2311/106; B01D 2311/2623; B01D 61/364; B01D 61/46; B01D 3/00; B01D 61/422; B08B 3/08; H01L 21/02041
See application file for complete search history.

(56) References Cited

U.S. PATENT DOCUMENTS

| | | | |
|---|---|---|---|
| 6,045,684 A | 4/2000 | Wakita et al. | |
| 6,187,189 B1 | 2/2001 | Ledon et al. | |
| 6,783,748 B2 | 8/2004 | Tanaka et al. | |
| 7,473,412 B2 | 1/2009 | Owen et al. | |
| 2011/0318610 A1 | 12/2011 | Rabaey et al. | |
| 2019/0232229 A1* | 8/2019 | Miyazaki | C02F 1/42 |
| 2020/0290873 A1 | 9/2020 | Yokoi et al. | |

FOREIGN PATENT DOCUMENTS

| | | | |
|---|---|---|---|
| JP | H 03026390 | 2/1991 | |
| JP | H 07312451 | 11/1995 | |
| JP | 2002500612 | 1/2002 | |
| JP | 2007507411 | 3/2007 | |
| JP | 2011147880 A | 8/2011 | |
| JP | 2012196619 A | 10/2012 | |
| JP | 2014121669 A | 7/2014 | |
| KR | 1020010013065 A | 2/2001 | |
| TW | 450941 B | 8/2001 | |
| TW | 526168 B | 4/2003 | |
| WO | WO-2016179241 A1 * | 11/2016 | C02F 1/04 |
| WO | WO 2018074127 | 4/2018 | |

OTHER PUBLICATIONS

International Search Report and Written Opinion of the International Searching Authority, mailed on May 14, 2019, from International Application No. PCT/KR2019/001135, filed on January 25, 2019. 15 pages.

* cited by examiner

METHOD FOR PURIFYING HYDROGEN PEROXIDE

RELATED APPLICATIONS

This application is a § 371 National Phase Application of International Application No. PCT/KR2019/001135, filed on Jan. 25, 2019, now International Publication No. WO 2020/036274, published on Feb. 20, 2020, which International Application claims priority to Korean Application No. 10-2018-0096017, filed on Aug. 17, 2018, both of which are incorporated herein by reference in their entirety.

TECHNICAL FIELD

The present invention relates to a method for purifying hydrogen peroxide, and more particularly, to a method for purifying hydrogen peroxide, the method including an electrodeionization process.

BACKGROUND ART

Hydrogen peroxide has strong oxidation force and decomposition products thereof are harmless. Thus, hydrogen peroxide is used as an oxidization agent, a bleaching agent for silk threads or wool, and a catalyst for vinyl polymerization in the plastics industry. Moreover, hydrogen peroxide is also used for semiconductor wafer cleaning in addition to the above uses.

Techniques for cleaning a semiconductor wafer may be classified into wet cleaning and dry cleaning. A cleaning process is similar to an etching process in that substances on the surface of a semiconductor wafer are removed but is different therefrom in that impurities present on the surface of a semiconductor wafer are selectively removed. As a representative wet cleaning method, there is a chemical wet method using hydrogen peroxide.

DISCLOSURE OF THE INVENTION

Technical Problem

The present invention provides a method for purifying hydrogen peroxide, the method capable of producing hydrogen peroxide of high purity.

Technical Solution

A method for purifying hydrogen peroxide according to the inventive concept of the present invention may include purifying a crude product of hydrogen peroxide using a primary purification system and purifying a primarily purified hydrogen peroxide solution using a secondary purification system. One of the primary purification system and the secondary purification system may include an electrodeionization system, and the other one of the primary purification system and the secondary purification system may include at least one from among a distillation system, a resin system, a reverse osmosis system, and a combination system thereof.

A method for manufacturing a semiconductor device according to another inventive concept of the present invention may include performing a cleaning process on a semiconductor substrate using hydrogen peroxide purified according to the method for purifying hydrogen peroxide.

Advantageous Effects

A method for purifying hydrogen peroxide according to the present invention may obtain hydrogen peroxide of high purity to a high yield and in a large amount through an electrodeionization system. The obtained hydrogen peroxide may be used for a process of cleaning a semiconductor substrate and may prevent defects in a semiconductor process.

MODE FOR CARRYING OUT THE INVENTION

Figure 1:
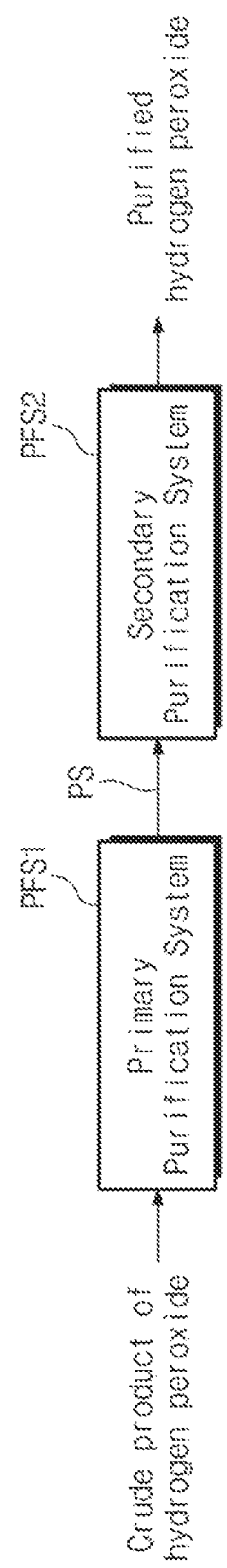
FIG. 1 is a schematic view for describing a hydrogen peroxide purification system according to embodiments of the present invention.

In order to facilitate sufficient understanding of the configuration and effects of the present invention, preferred embodiments of the present invention will be described with reference to the accompanying drawings. However, the present invention is not limited to the embodiments set forth below and may be embodied in various forms and modified in many alternate forms. Rather, these embodiments are provided so that this disclosure will be thorough and complete and will fully convey the scope of the present invention to those skilled in the art to which the present invention pertains.

In the present description, when an element is referred to as being on another element, it means that the element may be directly formed on another element, or that a third element may be interposed therebetween. Also, in the drawings, the thickness of elements are exaggerated for an effective description of technical contents. Like reference numerals refer to like elements throughout the specification.

Although the terms such as first, second, third, and the like are used to describe various elements in various embodiments of the present description, these elements should not be limited by these terms. These terms are only used to distinguish one element from another. The embodiments described and exemplified herein also include the complementary embodiments thereof.

The terms used herein are for the purpose of describing embodiments and are not intended to be limiting of the present invention. In the present description, singular forms include plural forms unless the context clearly indicates otherwise. As used herein, the terms 'comprises' and/or 'comprising' are intended to be inclusive of the stated elements, and do not exclude the possibility of the presence or the addition of one or more other elements.

Figure 2:
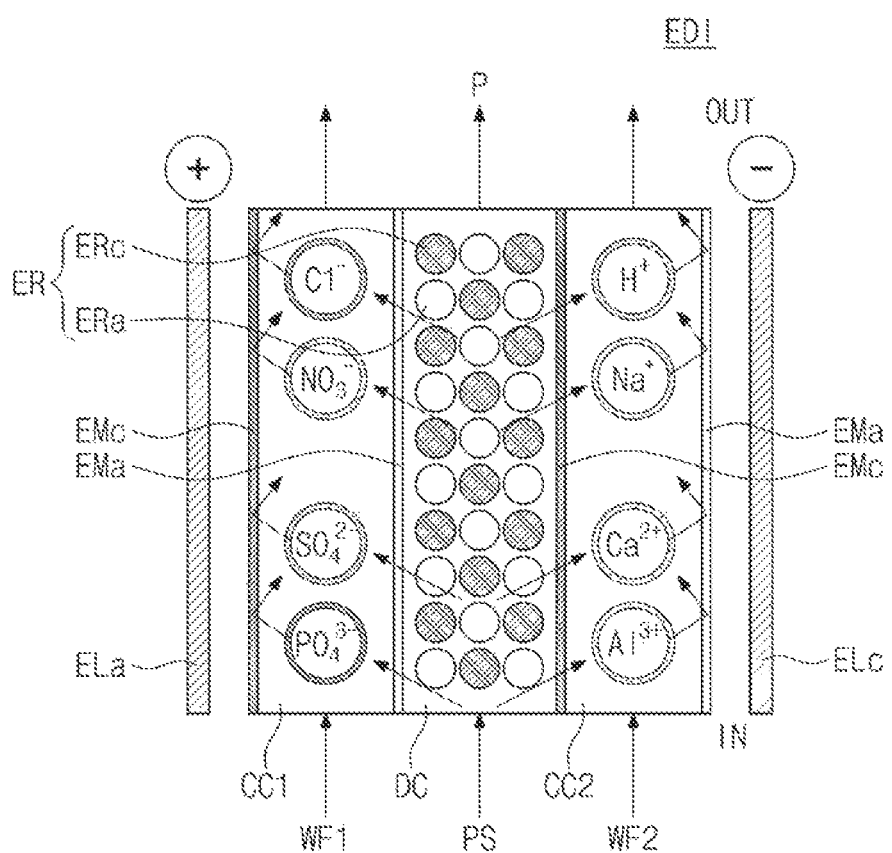
FIG. 2 is a schematic view for describing an electrodeionization system of the hydrogen peroxide purification system of FIG. 1.

FIG. 1 is a schematic view for describing a hydrogen peroxide purification system according to embodiments of the present invention. FIG. 2 is a schematic view for describing an electrodeionization system of the hydrogen peroxide purification system of FIG. 1.

Referring to FIG. 1 and FIG. 2, the hydrogen peroxide purification system may include a primary purification system PFS1 and a secondary purification system PFS2. A crude product R of hydrogen peroxide is purified sequentially through the primary purification system PFS1 and the secondary purification system PFS2, and purified hydrogen peroxide P may be finally obtained from the crude product R of hydrogen peroxide.

The crude product R of hydrogen peroxide may be produced by an alkyl anthraquinone process. The crude product R of hydrogen peroxide may be a product synthesized by an alkyl anthraquinone hydrogenation-oxygenation reaction. The crude product R of hydrogen peroxide may be a product of an alkyl anthraquinone process which has not been subjected to a purification process such as distillation.

Specifically, when hydrogen is added to alkyl anthraquinone to produce hydroquinone and then the hydroquinone is reacted with oxygen in the air, the hydroquinone is reduced back to anthraquinone, which may produce hydrogen peroxide. The crude product R of hydrogen peroxide may be extracted and obtained by adding water to anthraquinone, which is a product of an oxidization reaction, and hydrogen peroxide.

The crude product R of hydrogen peroxide produced by the alkyl anthraquinone process may include metal impurities such as Fe. Cr, Al, and Na having a concentration of 10 ppb or greater, anion impurities such as $PO_4^{3-}$, $SO_4^{2-}$, $NO_3^-$, and $Cl^-$ having a concentration of 10 ppb or greater, and a total organic carbon (TOC) having a concentration of 100 ppm or greater.

The crude product R of hydrogen peroxide may be introduced into the primary purification system PFS1. The primary purification system PFS1 may include a distillation system, a resin system, a reverse osmosis system, or a combination system thereof. In other words, a distillation process, a resin process, a reverse osmosis process, or a combination process thereof may be performed on the crude product R of hydrogen peroxide using the primary purification system PFS1.

In one embodiment, the distillation system may include a distillation column. A distillation process may be performed on the crude product R of hydrogen peroxide using the distillation system. Specifically, impurities in the crude product R of hydrogen peroxide may be concentrated at a lower end portion of the distillation column through the distillation process. From an upper end portion of the distillation column, a distilled hydrogen peroxide solution may be obtained. As a result, some of the impurities (e.g., metal impurities, anion impurities and TOC) in the crude product R of hydrogen peroxide are removed through the distillation system, so that a hydrogen peroxide solution with increased purity may be obtained.

In one embodiment, the resin system may include a pretreatment resin. The pretreatment resin may include a resin containing a porous polymer, an ion exchange resin having a cation/anion functional group, or a combination thereof. For example, the pretreatment resin may include a commercially available resin, such as AMBERLITE SCAV Resin of Dow Co., Ltd or PAD Resin of Purolite Co., Ltd. A used pretreatment resin may be regenerated by steam treatment or chemical treatment using methanol, hydrochloric acid, and the like. The resin system may further include a plurality of adsorption filters which are capable of removing an organic carbon. Some of the impurities in the crude product R of hydrogen peroxide may be removed through a resin process using the resin system.

In one embodiment, the reverse osmosis system may include a vessel and a reverse osmosis membrane in the vessel. Through a reverse osmosis process using the reverse osmosis system, some of the impurities in the crude product R of hydrogen peroxide may be removed.

As a result, some of the impurities in the crude product R of hydrogen peroxide are removed through the primary purification system PFS1, so that a hydrogen peroxide solution PS primarily purified may be obtained.

The hydrogen peroxide solution PS primarily purified may be introduced into the secondary purification system PFS2. The secondary purification system PFS2 may include an electrodeionization system EDL. An electrodeionization process may be performed on the hydrogen peroxide solution PS using the electrodeionization system EDI.

Referring back to FIG. 2, the electrodeionization system EDI may include a first electrode ELa, a second electrode ELc, a first concentrate chamber CC1, a second concentrate chamber CC2, and a dilute chamber DC between the first and second concentrate chambers CC1 and CC2. The first and second concentrate chambers CC1 and CC2 and the dilute chamber DC may be interposed between the first and second electrodes ELa and ELc. For example, the first electrode ELa may be an anode, and the second electrode ELc may be a cathode.

Anion exchange membranes EMa and cation exchange membranes EMc may be alternately disposed between the first and second electrodes ELa and ELc. For example, one of the anion exchange membranes EMa may be interposed between the first concentrate chamber CC1 and the dilute chamber DC. The other one of the anion exchange membranes EMa may be interposed between the second concentrate chamber CC2 and the second electrode ELc. One of the cation exchange membranes EMc may be interposed between the second concentrate chamber CC2 and the dilute chamber DC. The other one of the cation exchange membranes EMc may be interposed between the first concentrate chamber CC1 and the first electrode ELa. The anion exchange membrane EMa may transmit anions, but not cations. The cation exchange membrane EMc may transmit cations, but not anions.

An ion exchange resin ER may be provided in the dilute chamber DC. The ion exchange resin ER may include an anion exchange resin ERa and a cation exchange resin ERc. The anion exchange resin ERa may adsorb anions, and move the same to the anion exchange membrane EMa. The cation exchange resin ERc may adsorb cations, and move the same to the cation exchange membrane EMc. For example, the ion exchange resin ER may prevent the resistance of the hydrogen peroxide solution PS from increasing even when the concentration of ions in the hydrogen peroxide solution PS decreases.

The cation exchange membrane EMc and the cation exchange resin ERc of the electrodeionization system EDI according to the present invention may be pretreated with an acid. For example, the cation exchange membrane EMc and the cation exchange resin ERc may be pretreated with 1 wt % to 10 wt % of an acid solution (HCl, $H_2SO_4$, $HNO_3$, etc.). As a result, $Na^+$ (Sodium Form), which is an end group of the cation exchange membrane EMc and the cation exchange resin ERc, may be converted into $H^+$ (Hydrogen Form). As a result, the stability of the electrodeionization system EDI for the hydrogen peroxide solution PS may be improved.

The hydrogen peroxide solution PS and water may be introduced into an inlet IN of the electrodeionization system EDI. The water may be purified water having low electrical conductivity. The concentration of hydrogen peroxide in the hydrogen peroxide solution PS to be introduced may be 1 wt % to 70 wt %. The hydrogen peroxide solution PS may be introduced into the dilute chamber DC, and the water may be introduced into the first concentrate chamber CC1 and the second concentrate chamber CC2. The concentration of hydrogen peroxide in a first concentrate WF1 to be introduced into the first concentrate chamber CC1 and the concentration of a second concentrate WF2 to be introduced into the second concentrate chamber CC2 may be 1 wt % or less.

Direct current power may be applied between the first and second electrodes ELa and ELc to allow a current to flow from the first electrode ELa to the second electrode ELc. Cations (e.g., metal impurities) of the hydrogen peroxide solution PS in the dilute chamber DC may pass through the cation exchange membrane EMc by electrostatic attraction generated through the direct current power and move to the second concentrate WF2 of the second concentrate chamber CC2. Anions (e.g., anion impurities) of the hydrogen peroxide solution PS in the dilute chamber DC may pass through the anion exchange membrane EMa by electrostatic attraction generated through the direct current power and move to the first concentrate WF1 of the first concentrate chamber CC1.

The concentration of ions in the hydrogen peroxide solution PS may decrease from the inlet IN of the dilute chamber DC to an outlet OUT thereof. In other words, the concentration of impurities in the hydrogen peroxide solution PS may decrease from the inlet IN of the dilute chamber DC to the outlet OUT thereof. The purified hydrogen peroxide P may be discharged through the outlet OUT of the dilute chamber DC.

The first concentrate WF1 and the second concentrate WF2 may be discharged through the outlet OUT of each of the first and second concentrate chambers CC1 and CC2. Impurities transferred from the hydrogen peroxide solution PS may be concentrated and present in the discharged first concentrate WF1 and the second concentrate WF2. For example, the discharged first concentrate WF1 and second concentrate WF2 may be discarded. For another example, the first concentrate WF1 and the second concentrate WF2 may be filtered and then introduced back into the inlet IN of the electrodeionization system EDI. That is, the first concentrate WF1 and the second concentrate WF2 may be circulated in the electrodeionization system EDI.

Since the concentration of the ions in the hydrogen peroxide solution PS decreases from the inlet IN of the dilute chamber DC to the outlet OUT thereof, in one region of the dilute chamber DC adjacent to the outlet OUT, the resistance of the hydrogen peroxide solution PS may increase. As a result, in the one region of the dilute chamber DC, a voltage drop may occur, so that decomposition of water and/or decomposition of hydrogen peroxide may occur. Hydrogen ions and hydroxide ions may be produced by the decomposition of water and/or the decomposition of hydrogen peroxide, and the produced hydrogen ions and hydroxide ions may regenerate the ion exchange resin ER. Therefore, the electrodeionization system EDI according to the present invention may not require a separate process for regenerating the ion exchange resin ER.

The hydrogen peroxide purification system according to embodiments of the present invention uses the electrodeionization system EDI as the secondary purification system PFS2 for hydrogen peroxide, so that hydrogen peroxide of high purity may be obtained to a high yield. Furthermore, the electrodeionization system EDI may be operated at a relatively high flow rate (for example, 1 to 10 $m^3/hr$), so that hydrogen peroxide of high purity may be obtained in a large amount.

Figure 3:
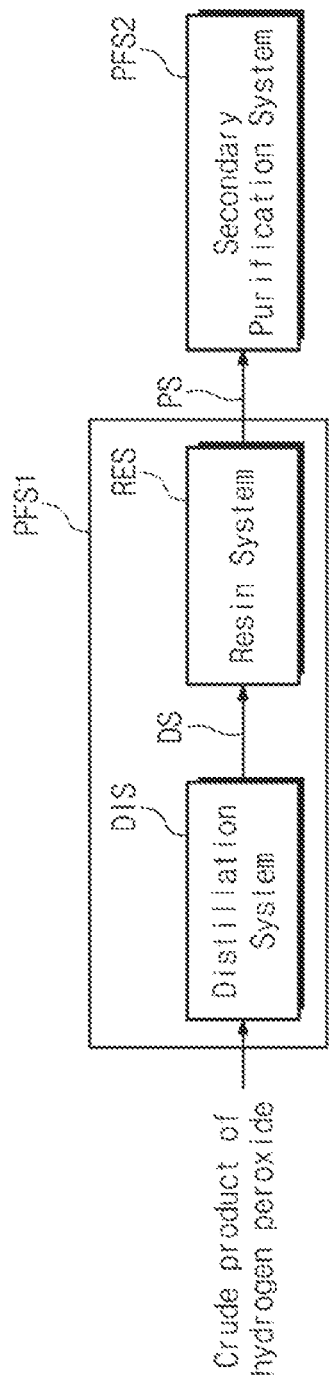
FIG. 3 is a schematic view for describing a hydrogen peroxide purification system according to embodiments of the present invention.

FIG. 3 is a schematic view for describing a hydrogen peroxide purification system according to embodiments of the present invention. In the present embodiment, a detailed description of the same technical features as those described above with reference to FIG. 1 and FIG. 2 will be omitted, and differences will be described in detail.

Referring to FIG. 3, the primary purification system PFS1 may include a distillation system DIS and a resin system RES. The crude product R of hydrogen peroxide may be first introduced into the distillation system DIS to be subjected to a distillation process. Distilled hydrogen peroxide solution DS may then be introduced into the resin system RES to be subjected to a resin process. The hydrogen peroxide solution PS passed through the primary purification system PFS1 may be introduced into the secondary purification system PFS2.

Example 1

Hydrogen peroxide was purified using the hydrogen peroxide purification process described with reference to FIG. 3. Specifically, a crude product of hydrogen peroxide produced by an alkyl anthraquinone process was distilled, and then subjected to primary purification through a pretreatment resin process. A hydrogen peroxide solution primarily purified was secondarily purified using the electrodeionization system EDI according to the present invention. The concentration of impurities in the hydrogen peroxide solution primarily purified and the concentration of impurities in the hydrogen peroxide solution secondarily purified by an electrodeionization process were measured and are shown in Table 1 below.

TABLE 1

| Items | TOC (ppm) | Metal (ppb) | | | | Anion (ppb) | | | |
| --- | --- | --- | --- | --- | --- | --- | --- | --- | --- |
| | | Na | Al | Cr | Fe | Cl | $SO_4$ | $NO_3$ | $PO_4$ |
| Primarily purified solution | 6.0 | 0.2 | 1.1 | 0.1 | 0.1 | 45 | 139 | 69 | 257 |

TABLE 1-continued

| Items | TOC (ppm) | Metal (ppb) | | | | Anion (ppb) | | | |
| --- | --- | --- | --- | --- | --- | --- | --- | --- | --- |
| | | Na | Al | Cr | Fe | Cl | SO$_4$ | NO$_3$ | PO$_4$ |
| Secondarily purified solution | 1.0 | <0.01 | <0.01 | <0.01 | <0.01 | 2 | 5 | 5 | 5 |
| Removal rate | 83% | 95% | 99% | 93% | 91% | 97% | 96% | 93% | 98% |

Referring to Table 1, it was confirmed that when the hydrogen peroxide solution primarily purified was secondarily purified by the electrodeionization process, TOC was removed by 83%, metal impurities were removed by 90% or greater, and anion impurities were removed by 90% or greater. As a result, it was confirmed that when a secondary purification process was additionally performed on the hydrogen peroxide solution primarily purified by the electrodeionization process, it was able to obtain a hydrogen peroxide solution of ultra-high purity.

Figure 4:
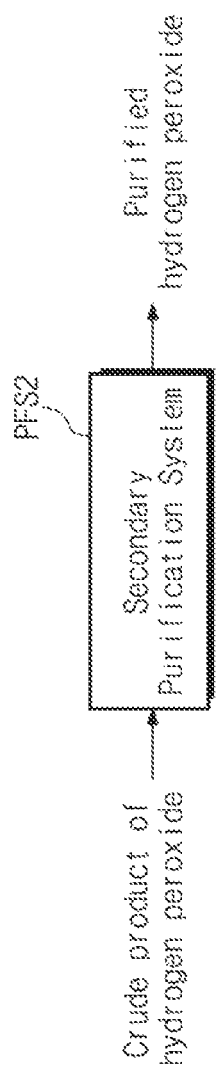
FIG. 4 is a schematic view for describing a hydrogen peroxide purification system according to embodiments of the present invention.

FIG. 4 is a schematic view for describing a hydrogen peroxide purification system according to embodiments of the present invention. In the present embodiment, a detailed description of the same technical features as those described above with reference to FIG. 1 and FIG. 2 will be omitted, and differences will be described in detail.

Referring to FIG. 4, the primary purification system PFS1 may be omitted. That is, the crude product R of hydrogen peroxide may be directly introduced into the electrodeionization system EDI which is the secondary purification system PFS2.

Example 2

Hydrogen peroxide was purified using the hydrogen peroxide purification process described with reference to FIG. 4. Unlike Example 1 above, a crude product of hydrogen peroxide produced by an alkyl anthraquinone process was immediately purified using the electrodeionization system EDI without distillation and primary purification. The concentration of impurities in the crude product of hydrogen peroxide and the concentration of impurities in a hydrogen peroxide solution purified by an electrodeionization process were measured and are shown in Table 2 below.

TABLE 2

| Items | TOC (ppm) | Metal (ppb) | | | | Anion (ppb) | | | |
| --- | --- | --- | --- | --- | --- | --- | --- | --- | --- |
| | | Na | Al | Cr | Fe | Cl | SO$_4$ | NO$_3$ | PO$_4$ |
| Crude product | 130 | 28 | 49 | 97 | 310 | 45 | 139 | 69 | 257 |
| Purified solution | 70 | 27 | 8 | 7 | 57 | 2 | 124 | 58 | 220 |
| Removal rate | 46% | 3% | 83% | 93% | 81% | 95% | 10% | 16% | 14% |

Referring to Table 2, it was confirmed that when the crude product of hydrogen peroxide was purified by the electrodeionization process, TOC was removed by 46%, metal impurities except Na were removed by about 80% or greater, and anion impurities except Cl$^-$ were removed by about 15%.

It can be confirmed that the concentration of impurities in a purified hydrogen peroxide solution obtained according to the present embodiment is higher than the concentration of impurities in the purified hydrogen peroxide solution of Example 1 above. That is, it was confirmed that when a hydrogen peroxide solution which had been subjected to a primary purification process was further subjected to the secondary purification by the electrodeionization process, it was able to obtain a hydrogen peroxide solution of higher purify.

Figure 5:
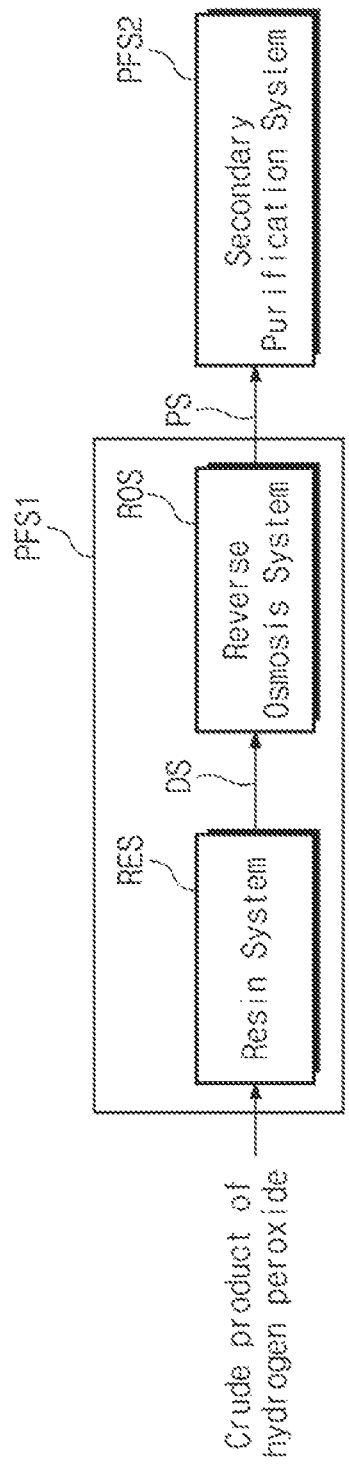
FIG. 5 is a schematic view for describing a hydrogen peroxide purification system according to embodiments of the present invention.

FIG. 5 is a schematic view for describing a hydrogen peroxide purification system according to embodiments of the present invention. In the present embodiment, a detailed description of the same technical features as those described above with reference to FIG. 1 and FIG. 2 will be omitted, and differences will be described in detail.

Referring to FIG. 5, the primary purification system PFS1 may include the resin system RES and a reverse osmosis system ROS. The crude product R of hydrogen peroxide may be first introduced into the resin system RES to be subjected to a resin process. A hydrogen peroxide solution which has been subjected to the resin process may then be introduced into the reverse osmosis system ROS to be subjected to a reverse osmosis process. Impurities in the crude product R of hydrogen peroxide may damage a reverse osmosis membrane. Therefore, when the crude product R of hydrogen peroxide is first subjected to the resin process, some of the impurities are removed, so that the lifespan of the reverse osmosis membrane may be extended.

Figure 6:
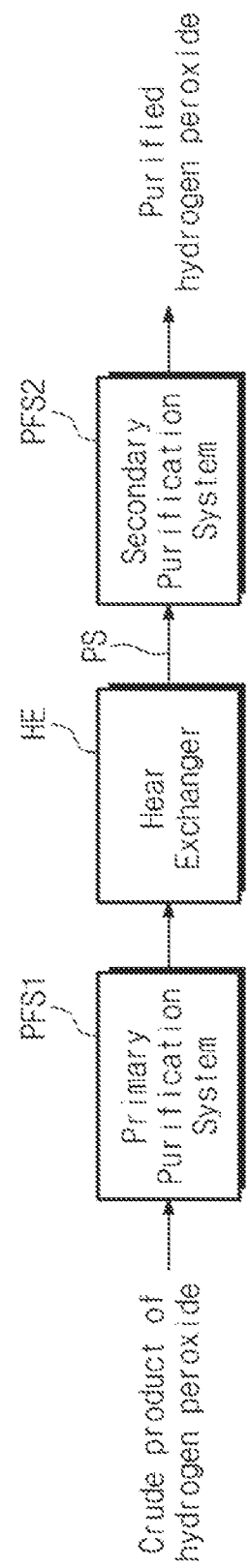
FIG. 6 is a schematic view for describing a hydrogen peroxide purification system according to embodiments of the present invention.

FIG. 6 is a schematic view for describing a hydrogen peroxide purification system according to embodiments of the present invention. In the present embodiment, a detailed description of the same technical features as those described above with reference to FIG. 1 and FIG. 2 will be omitted, and differences will be described in detail.

Referring to FIG. 6, the hydrogen peroxide purification system may further include a heat exchanger HE disposed between the first purification system PFS1 and the secondary purification system PFS2. When the hydrogen peroxide solution PS primarily purified passes through the heat exchanger HE, the temperature thereof may be adjusted. The heat exchanger HE may adjust the temperature of the hydrogen peroxide solution PS to −20° C. to 20° C. In other words, the hydrogen peroxide solution PS having a temperature of −20° C. to 20° C. may be introduced into the electrodeionization system EDI, which is the secondary purification system PFS2.

Since hydrogen peroxide is a strong oxidization agent, hydrogen peroxide may oxidize and age an ion exchange medium in the dilute chamber DC of the electrodeionization system EDI. Accordingly, the pressure in the electrodeionization system EDI may increase due to oxygen generated by decomposition of hydrogen peroxide caused by reduced resistance in the dilute chamber. As the temperature of hydrogen peroxide increases, the generation amount of oxygen may rapidly increase. If oxygen is excessively generated, the pressure in the electrodeionization system EDI excessively increases, so that the electrodeionization system EDI may be damaged and the efficiency of a purification process may be decreased.

According to the present embodiment, the temperature of the hydrogen peroxide solution PS to be introduced into the electrodeionization system EDI may be appropriately adjusted through the heat exchanger HE to prevent oxygen from being excessively generated. As a result, damage to the electrodeionization system EDI may be prevented and purification efficiency of hydrogen peroxide may be increased.

Figure 7:
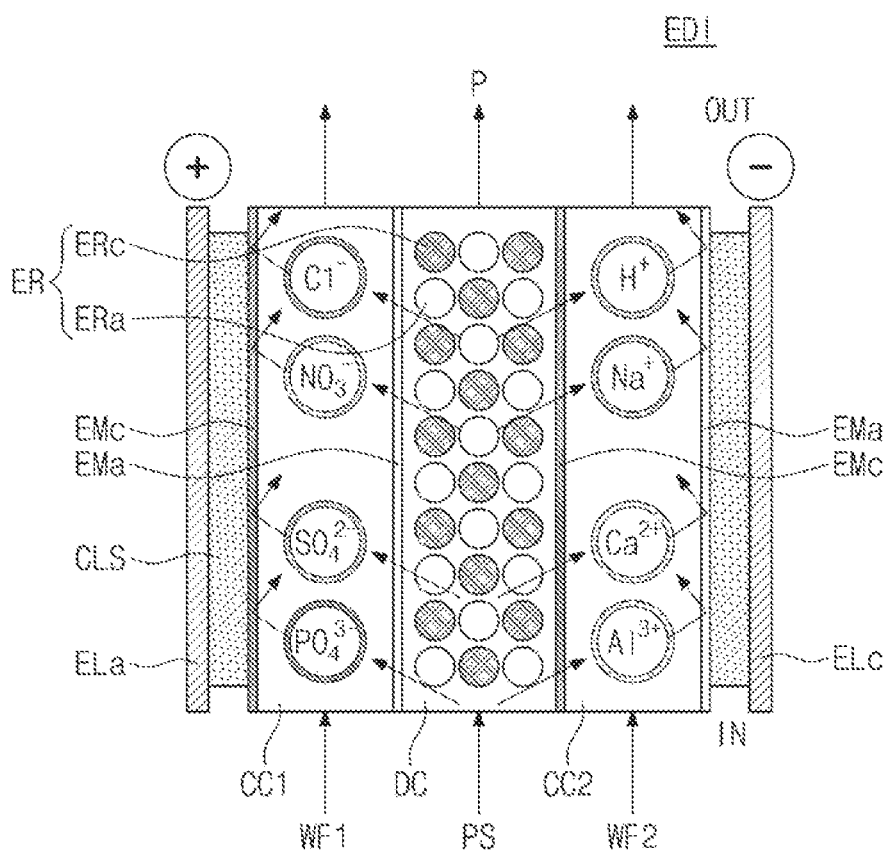
FIG. 7 is a schematic view for describing an electrodeionization system according to embodiments of the present invention.

FIG. 7 is a schematic view for describing an electrodeionization system according to embodiments of the present invention. In the present embodiment, a detailed description of the same technical features as those described above with reference to FIG. 1 and FIG. 2 will be omitted, and differences will be described in detail.

Referring to FIG. 7, the electrodeionization system EDI may further include a cooling system CLS. The cooling system CLS may be provided between the first electrode ELa and the first concentrate chamber CC1 and between the second electrode ELc and the second concentrate chamber CC2. The cooling system CLS may cool the hydrogen peroxide solution PS flowing in the dilute chamber DC.

As described above with reference to FIG. 6, when the temperature of the hydrogen peroxide solution PS increases, oxygen may be excessively generated, which may cause a process risk. According to the present embodiment, the hydrogen peroxide solution PS in the dilute chamber DS is cooled through the cooling system CLS, so that oxygen may be prevented from being excessively generated.

Figure 8:
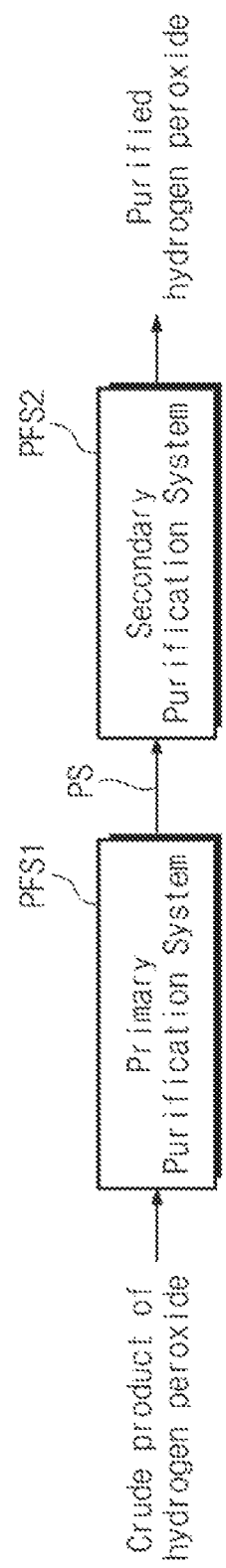
FIG. 8 is a schematic view for describing a hydrogen peroxide purification system according to embodiments of the present invention.

FIG. 8 is a schematic view for describing a hydrogen peroxide purification system according to embodiments of the present invention. In the present embodiment, a detailed description of the same technical features as those described above with reference to FIG. 1 and FIG. 2 will be omitted, and differences will be described in detail.

Referring to FIG. 8, the crude product R of hydrogen peroxide may be introduced into the primary purification system PFS1. The primary purification system PFS1 may include the electrodeionization system EDI. Some of the impurities in the crude product R of hydrogen peroxide are removed through the electrodeionization system EDI, so that a hydrogen peroxide solution PS primarily purified may be obtained.

The hydrogen peroxide solution PS primarily purified may be introduced into the secondary purification system PFS2. The secondary purification system PFS2 may include the electrodeionization system EDI, a distillation system, a resin system, a reverse osmosis system, or a combination system thereof. In other words, an electrodeionization process, a distillation process, a resin process, a reverse osmosis process, or a combination process thereof may be performed on the crude product R of hydrogen peroxide using the primary purification system PFS1. Impurities in the hydrogen peroxide solution PS are removed through the secondary purification system PFS2, so that the purified hydrogen peroxide P may be obtained.

Figure 9:
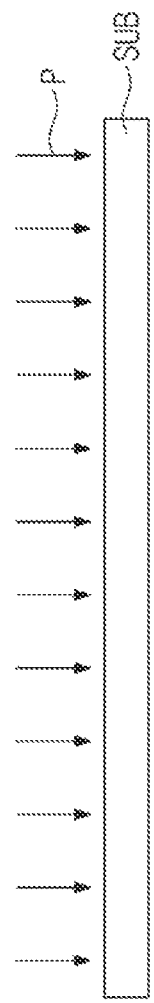
FIG. 9 is a schematic view for describing a process of cleaning a semiconductor substrate using hydrogen peroxide purified according to embodiments of the present invention.

Through the method for purifying hydrogen peroxide according to the above-described embodiments of the present invention, hydrogen peroxide of high purity may be obtained. FIG. 9 is a schematic view for describing a process of cleaning a semiconductor substrate using hydrogen peroxide purified according to embodiments of the present invention.

Referring to FIG. 9, a method for manufacturing a semiconductor device may include a process of cleaning a semiconductor substrate SUB. Specifically, the process of cleaning the semiconductor substrate SUB may include applying the purified hydrogen peroxide P by the purification method of the present invention on the semiconductor substrate SUB. For example, the semiconductor substrate SUB may include silicon, germanium, or silicon-germanium.

If hydrogen peroxide containing impurities are used in the cleaning process, the impurities may react with substances on the semiconductor substrate SUB, and may cause defects in a semiconductor process. Meanwhile, the purified hydrogen peroxide P according to the present invention has impurities in a very low content, so that defects in the semiconductor process may be prevented.

Although the present invention has been described with reference to the accompanying drawings, it will be understood by those having ordinary skill in the art to which the present invention pertains that various changes in form and details may be made therein without departing from the spirit and scope of the present invention. Therefore, it is to be understood that the above-described embodiments described above are exemplary and non-limiting in every respect.

The invention claimed is:

1. A method for purifying hydrogen peroxide, the method comprising:
   purifying a crude product of hydrogen peroxide using a primary purification system;
   allowing a primarily purified hydrogen peroxide solution to pass through a heat exchanger; and
   purifying the primarily purified hydrogen peroxide solution using an electrodeionization system, wherein:
      the primary purification system includes at least one from among a distillation system, a resin system, a reverse osmosis system, and a combination system thereof,
      the heat exchanger is configured to adjust the temperature of the primarily purified hydrogen peroxide solution to prevent excessive oxygen generation in the electrodeionization system, and
      the heat exchanger adjusts the temperature of the primarily purified hydrogen peroxide solution to a range from $-20°$ C. to $20°$ C.

2. The method of claim 1, wherein the electrodeionization system comprises:
   a first electrode and a second electrode;
   a first concentrate chamber, a second concentrate chamber, and a dilute chamber between the first and second concentrate chambers;
   an ion exchange resin provided inside the dilute chamber;
   an anion exchange membrane between the first concentrate chamber and the dilute chamber; and
   a cation exchange membrane between the second concentrate chamber and the dilute chamber.

3. The method of claim 2, wherein:
   direct current power is applied to the first electrode and the second electrode;

anion impurities in the hydrogen peroxide solution inside the dilute chamber pass through the anion exchange membrane and move to the first concentrate chamber; and cation impurities in the hydrogen peroxide solution in the dilute chamber pass through the cation exchange membrane and move to the second concentrate chamber.

4. The method of claim 2, wherein:

a first concentrate and a second concentrate are respectively introduced into the first concentrate chamber and the second concentrate chamber; and the first concentrate and the second concentrate are water.

5. The method of claim 1, wherein the purifying of using the primary purification system comprises:

performing a distillation process on a crude product of hydrogen peroxide; and purifying a resin process on a distilled hydrogen peroxide solution.

6. The method of claim 1, wherein the purifying of using the primary purification system comprises:

performing a resin process on a crude product of hydrogen peroxide; and performing a reverse osmosis process on a hydrogen peroxide solution which has been subjected to the resin process.

7. The method of claim 1, wherein the electrodeionization system comprises a cooling system for cooling the hydrogen peroxide solution.

8. A method for manufacturing a semiconductor device, the method comprising:

purifying a crude product of hydrogen peroxide using a primary purification system;

allowing a primarily purified hydrogen peroxide solution to pass through a heat exchanger;

purifying the primarily purified hydrogen peroxide solution using an electrodeionization system; and performing a cleaning process on a semiconductor substrate using the purified hydrogen peroxide, wherein:

the primary purification system includes at least one from among a distillation system, a resin system, a reverse osmosis system, and a combination system thereof, the heat exchanger is configured to adjust the temperature of the primarily purified hydrogen peroxide solution to prevent excessive oxygen generation in the electrodeionization system, and the heat exchanger adjusts the temperature of the primarily purified hydrogen peroxide solution to a range from −20° C. to 20° C.

* * * * *